(12) United States Patent
Chen et al.

(10) Patent No.: US 12,454,647 B2
(45) Date of Patent: Oct. 28, 2025

(54) METHOD FOR REACTIVE ION ETCHING

(71) Applicant: National Cheng Kung University, Tainan (TW)

(72) Inventors: Tse-Ming Chen, Tainan (TW); Chiu-Hua Huang, Tainan (TW); Ching-Hua Kao, Tainan (TW); Yu-Chiang Hsieh, Tainan (TW)

(73) Assignee: National Cheng Kung University, Tainan (TW)

( * ) Notice: Subject to any disclaimer, the term of this patent is extended or adjusted under 35 U.S.C. 154(b) by 310 days.

(21) Appl. No.: 18/077,171

(22) Filed: Dec. 7, 2022

(65) Prior Publication Data

US 2024/0191135 A1    Jun. 13, 2024

(51) Int. Cl.
*C09K 13/08* (2006.01)
*H01L 21/311* (2006.01)

(52) U.S. Cl.
CPC .................. *C09K 13/08* (2013.01)

(58) Field of Classification Search
None
See application file for complete search history.

(56) References Cited

U.S. PATENT DOCUMENTS

| 10,872,779 | B2 | 12/2020 | Miyoshi et al. |
| 2016/0260586 | A1 | 9/2016 | Chai |
| 2017/0200602 | A1* | 7/2017 | Kikuchi ............... H01L 21/3065 |
| 2019/0304773 | A1* | 10/2019 | Lee ............ F26B 5/06 |
| 2022/0359215 | A1* | 11/2022 | Vervuurt ............ C23C 16/45538 |
| 2023/0411161 | A1* | 12/2023 | Kim .................. H01L 21/31122 |

* cited by examiner

*Primary Examiner* — Shamim Ahmed
(74) *Attorney, Agent, or Firm* — LANWAY IPR SERVICES; Chun-Ming Shih

(57) ABSTRACT

A method for reactive ion etching includes placing a film in a vacuum chamber, introducing an etching gas, performing reactive ion etching for a first duration, stopping the reactive ion etching and extracting the remaining gas in a second duration so that the chamber reaches a high-clean state with a pressure below 0.1 Pa, and repeating these steps until a predetermined etching depth is reached.

5 Claims, 7 Drawing Sheets

METHOD FOR REACTIVE ION ETCHING

BACKGROUND OF THE INVENTION

1. Field of the Invention

The present invention is in related to a method for etching, more particularly to a method for reactive ion etching.

2. Description of the Prior Art

Reactive ion Etching (RIE) is a process commonly used in semiconductor manufacturing processes. It uses plasma-enhanced reactive ion gas to bombard the target material to achieve the purpose of etching. It has been commonly used to etch film made of silicon dioxide and various metal oxides or complex oxides.

In recent years, the two-dimensional materials have the advantages of high carrier mobility, light weight and low energy consumption, and miniaturization of components, making the two-dimensional materials have great potential in electronics, optics, optoelectronics, electron spin, battery materials, quantum information and biomedical applications. The two-dimensional material refers to a material that is stacked in layers by Van der Waals force and it can be semiconductor, semimetal, and insulator. However, at present, the reactive ion etching applied to the two-dimensional material leads to unmeet surface roughness, having a negative impact on the subsequent application value.

Therefore, how to improve the surface roughness after reactive ion etching of two-dimensional material is worthy of consideration by a person having ordinary skill in the art.

SUMMARY OF THE INVENTION

A method for reactive ion etching is provided in the present disclosure, that can improve the surface roughness of the etched film. The detail shows as following:

A method for reactive ion etching includes:
(a) placing a film to be etched in a vacuum chamber;
(b) introducing an etching gas into the vacuum chamber;
(c) starting a reactive ion etching to etch the film via the etching gas in a first duration;
(d) in a second duration, stopping reactive ion etching and extracting the remaining gas in the vacuum chamber to make the vacuum chamber be in a high-clean state; and
(e) repeating step (b) to (d) until an etching depth of the film is reached to a predetermined value.

Another method for reactive ion etching is provided in the present disclosure, the method includes:
(a) placing a film to be etched in a vacuum chamber;
(b) introducing an etching gas into the vacuum chamber;
(c) starting a reactive ion etching to etch the film via the etching gas in a first duration;
(d) in a second duration, stopping reactive ion etching and moving the film to another vacuum chamber in a high-clean state; and
(e) repeating step (b) to (d) until an etching depth of the film is reached to a predetermined value.

The foregoing, as well as additional objects, features and advantages of the invention will be more readily apparent from the following detailed description, which proceeds with reference to the accompanying drawings.

DESCRIPTION OF THE PREFERRED EMBODIMENTS

Figure 1A:
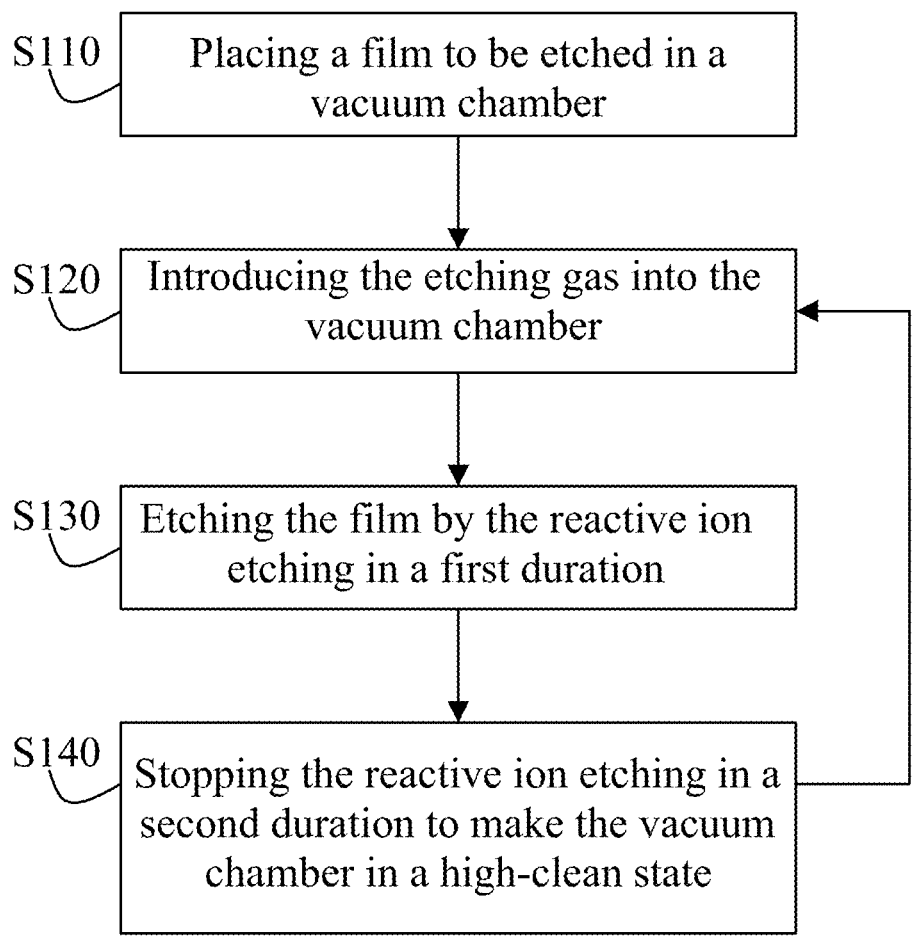
FIG. 1A shows the method for reactive ion etching of the present disclosure.

Please refer to FIG. 1A. FIG. 1A shows the method for reactive ion etching of the present disclosure. The method for reactive ion etching of the present disclosure is carried out by the reactive ion etching equipment. The reactive ion etching equipment has a vacuum chamber and the etching gas can be introduced into or extracted from the vacuum chamber. In the embodiment, the reactive ion etching equipment (model: EIS-700) provided by Japanese company ELIONIX INC. is used to perform the reactive ion etching.

First, the step S110 of placing a film to be etched in a vacuum chamber is performed. In other words, the film is placed in the vacuum chamber of the reactive ion etching equipment. The material of the film is silicon dioxide ($SiO_2$) or other metal oxides, such as titanium dioxide ($TiO_2$) or aluminum oxide ($Al_2O_3$). In other embodiments, the material of the film is a two-dimensional material, i.e. single-layer material. Specifically, the two-dimensional material is selected from the group consisting of graphene, transition metal dichalcogenides, silicene, germanene and hexagonal boron nitride (h-BN).

Next, the step S120 of introducing an etching gas is performed, that is, the etching gas is directed into the vacuum chamber. In this embodiment, the introducing etching gas is sulfur hexafluoride ($SF_6$). In other embodiments, other kinds of etching gases are selected, and various etching gases are selected into the vacuum chamber in appropriate proportions.

Then, the step S130 of etching the film via the etching gas in a first duration is performed. In detail, low-power radio frequency (RF) and direct current (DC) are applied to the etching gas in the vacuum chamber to ionize the etching gas and make it impact the surface of the film to achieve the effect of etching. In the embodiment, the first duration is 2 seconds, that is, the etching gas is etching the film for 2 seconds. It should be noted that, in the steps S120 and S130, the etching gas is continuously introduced into the vacuum chamber, and at the same time, the by-products generated in the step S130 and the unreacted etching gas are continuously drawn out of the vacuum chamber.

Next, the step S140 of stopping the reactive ion etching in a second duration is executed. In other words, the radio frequency and direct current are turn off and the supply of the etching gas is stopped, so that the etching gas stops etching the film. At the same time, the remaining etching gas in the vacuum chamber and the by-products generated in step S130 are extracted to make the vacuum chamber in a high-clean state. In another embodiment, the step S140 further includes a step of introducing an inert gas into the vacuum chamber. In the step S140, the gas is continuously extracted from the vacuum chamber, so the inert gas is introduced to form a gas flow in the vacuum chamber, so as to remove the by-products caused by etching. In other embodiments, the introduced gas in the step S140 is not limited to the inert gas, and the other gases that do not affect the etching of the film can also be selected.

In details, in the second duration the reactive ion etching is stopped and the remaining etching gas and the by-products generated after etching are evacuated from the vacuum chamber in the second duration, so as to make the vacuum chamber in a high-clean state. In the embodiment the second duration is 2 seconds, in another embodiment it is 10 seconds, and in other embodiment the second duration can even be more than 10 seconds. It should be noted that, in the embodiment, the second duration is counted from the stop of reactive ion etching. In addition, the purpose of the step S140 is to remove the remaining etching gas and by-products after etching in the vacuum chamber, so the second duration is not limited to 2 seconds or 10 seconds. In the case of using different equipment, as long as the etching gas and the by-products after etching in the vacuum chamber are removed, it can be regarded that the step S140 is completed.

After that, the steps S120 to S140 are repeatedly performed until the etching depth of the film reaches a predetermined value. The predetermined value is, for example, the depth to be etched. Specifically, the etching is repeatedly performed and stopped until the desired etching depth is reached. The time during which the film is etched by the etching gas is the first duration, and the time during which the reactive ion etching is stopped is the second duration. Therefore, the film is cyclically in contact with the etching gas and in a high-clean state until the etching depth meets the requirements.

Figure 1B:
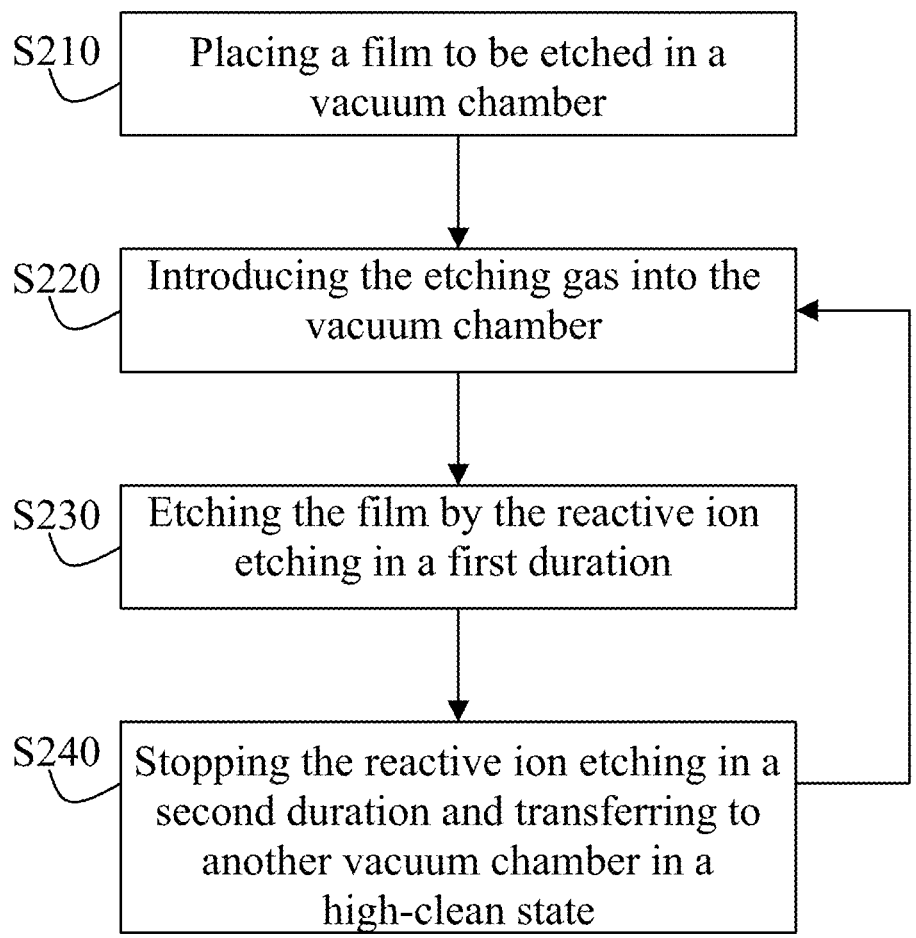
FIG. 1B shows a method for reactive ion etching of another embodiment.

Please refer to FIG. 1B. FIG. 1B shows a method for reactive ion etching of another embodiment. In FIG. 1B, the steps S210-S230 are similar to the steps S110-S130 in FIG. 1A and will not be repeated here. The feature of the embodiment is that in the step S240, after the reactive ion etching is stopped, i.e. the radio frequency and direct current are turned off and the etching gas is stopped, the film is moved to another vacuum chamber in a high-clean state, and the steps S220 to S240 are then performed again until the etching depth reaches the requirement.

In addition, in some embodiment, the following step is further performed. After the film is removed from the vacuum chamber, the vacuum chamber is evacuated to make the vacuum chamber in a high-clean state. At the same time, an inert gas can also be introduced continuously to form a gas flow in the vacuum chamber, to facilitate the removal of by-products after etching in the vacuum chamber. In the embodiment, the film is moved to another high-clean environment, and then the reactive ion etching is continued in another vacuum chamber. The method can avoid the influence of the residual etching gas and the by-products after etching in the original vacuum chamber.

Figure 1C:
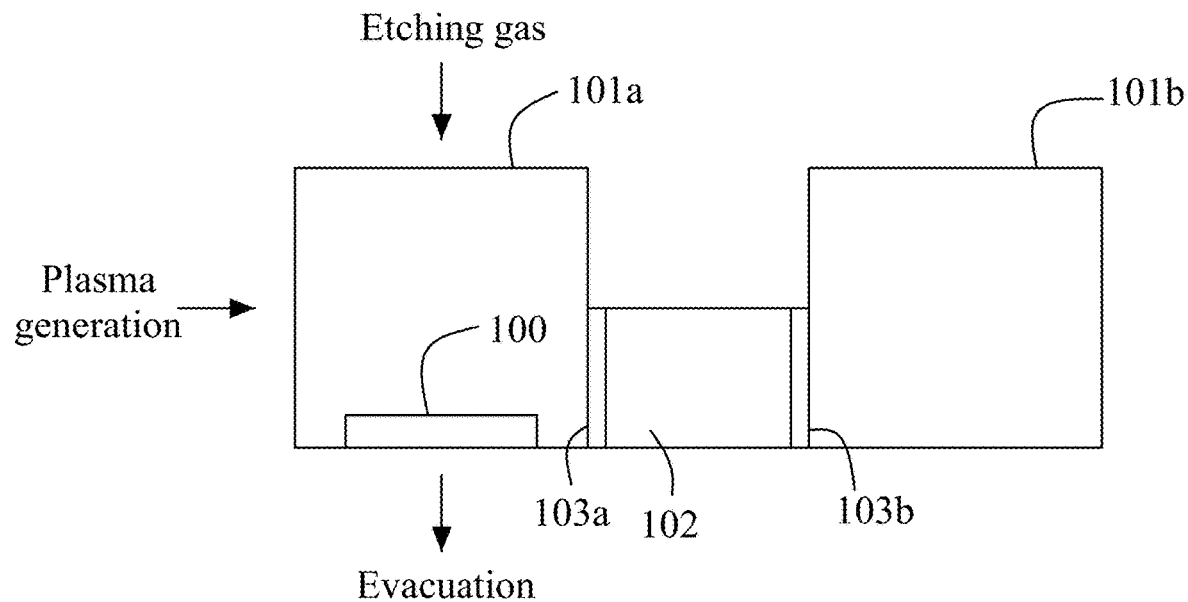
FIG. 1C and FIG. 1D which show the movement of the film.
Figure 1D:
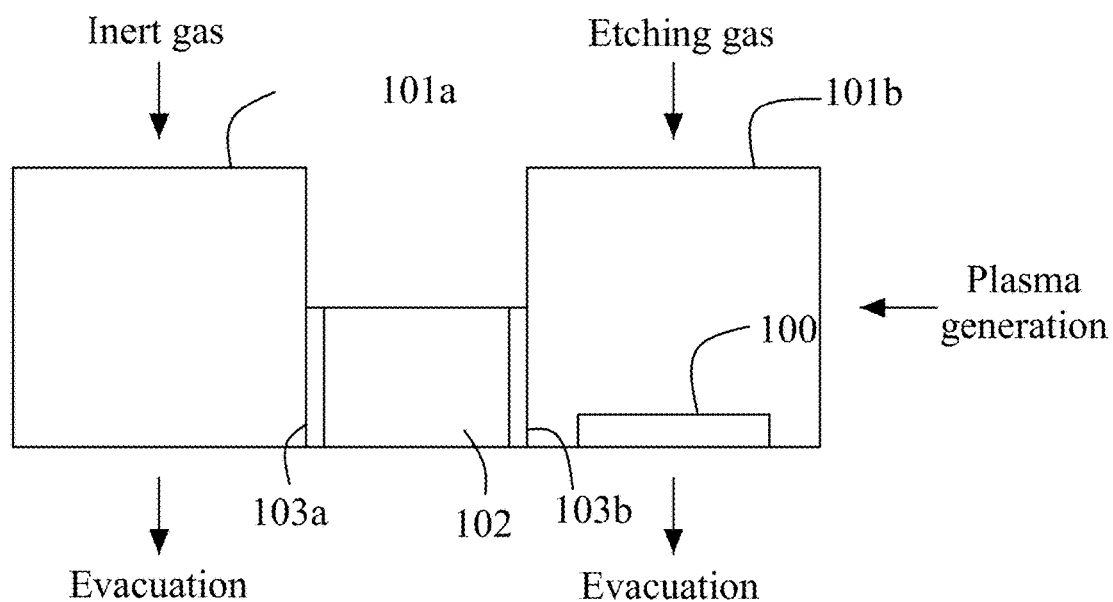

Please refer to FIG. 1C and FIG. 1D, which shows the movement of the film. Please refer to FIG. 1C first. When the steps S210 to S230 in FIG. 1B are performed, a device having a plurality of vacuum chambers 101a and 101b is used. The vacuum chambers 101a and 101b are connected by a channel 102, and on the channel 102 the gates 103a and 103b are provided to seal the vacuum chambers 101a and 101b. When the steps S210-S230 are performed, the film 100 is placed in the vacuum chamber 101a for reactive ion etching, so at this time the introduction of the etching gas, the evacuation, and plasma generation are performed in the vacuum chamber 101a. Next, please refer to FIG. 1D, after the film 100 is etched in the vacuum chamber 101a for the first duration, the gates 103a and 103b are opened, and the film layer 100 is moved via the channel 102 to the vacuum chamber 101b which is in a high-clean state, and then the gates 103a, 103b are closed. In some embodiment, a conveyor belt is used to move the film 100 from the vacuum chamber 101a to the vacuum chamber 101b. After that, the introduction of the etching gas, the evacuation, and plasma generation are performed in the vacuum chamber 101b. At this time, the evacuation and the introduction of the etching gas are continuously performed in the vacuum chamber 110a, so an air flow is formed in the vacuum chamber 101a to remove the by-products caused by etching, so that the vacuum chamber 101a is returned to a high-clean state. After the film 100 is etched in the vacuum chamber 101b for the first duration, the film 100 is moved back to the vacuum chamber 101a for continuous etching, and the evacuation and the introduction of the inert gas are continuously performed for cleaning in the vacuum chamber 110b. Therefore, by circulating the film 100 between the vacuum chamber 101a and the vacuum chamber 101b, i.e. the steps S220-S240 are repeated, until a desired etching depth is achieved.

It is worth noting. In the embodiment of FIGS. 1C and 1D, the steps S210 to S240 are performed between the two vacuum chambers 101a and 101b. In other embodiment, the vacuum chambers can be set in plural larger than two. Thus, the film can be moved between these plural vacuum chambers in turn until the etching depth is reached to a predetermined value.

The experimental result performed by the inventors is introduced as following in order to compare the methods for reactive ion etching of the prior art and the present disclosure. The method for reactive ion etching of the prior art is adapted in the control group. The method for reactive ion etching of the present disclosure is adapted in the first treatment group and the second treatment group, as shown in the steps S110 to S140 of FIG. 1A. In addition, in the control group, the first treatment group and the second treatment group, the material of the film, which is etched by method for reactive ion etching, is all SiO2.

In the control group, after the etching gas is introduced into the vacuum chamber and the pressure in the vacuum chamber is reached to 0.99 Pa, the reactive ion etching is started. In detail, the SF6 is introduced with 20 sccm of flow to etch the film for 60 seconds, the etching depth is reached to 18.12 nm. In other words, in the control group, the first duration is 60 seconds, and the second duration is 0 second.

In the first treatment group and the second treatment group, the steps S110 to S140 of FIG. 1A are performed. After the etching gas is introduced into the vacuum chamber and the reactive ion etching is performed for 2 seconds, the reactive ion etching is stopped, to bring the vacuum chamber in a high-clean state. In detail, the SF6 is introduced with 20 sccm of flow to etch the film for 2 seconds and the reactive ion etching is stopped subsequently to make the vacuum chamber be in the high-clean state. In addition, the SF6 is introduced only in this experiment, but it's not limited. The gas Ar can be introduced further.

In the first treatment group, the reactive ion etching is stopped for 2 seconds and the pressure in the vacuum chamber is reached to 0.07 Pa at that time. The steps S120 to S140 are cycled for 30 times, the total etching time is 60 seconds, and the etching depth is reached to 20.11 nm. In the second treatment group, the reactive ion etching is stopped for 10 seconds, and the pressure in the vacuum chamber is reached to 0.04 Pa at that time. The steps S120 to S140 are cycled for 30 times, the total etching time is 60 seconds, the etching depth is reached to 20.40 nm. In other words, the first duration in the first treatment group is 2 seconds, and the second duration in the first treatment group is 2 seconds; and the first duration in the second treatment group is 2 seconds, and the second duration in the second treatment group is 10 seconds.

Figure 2A:
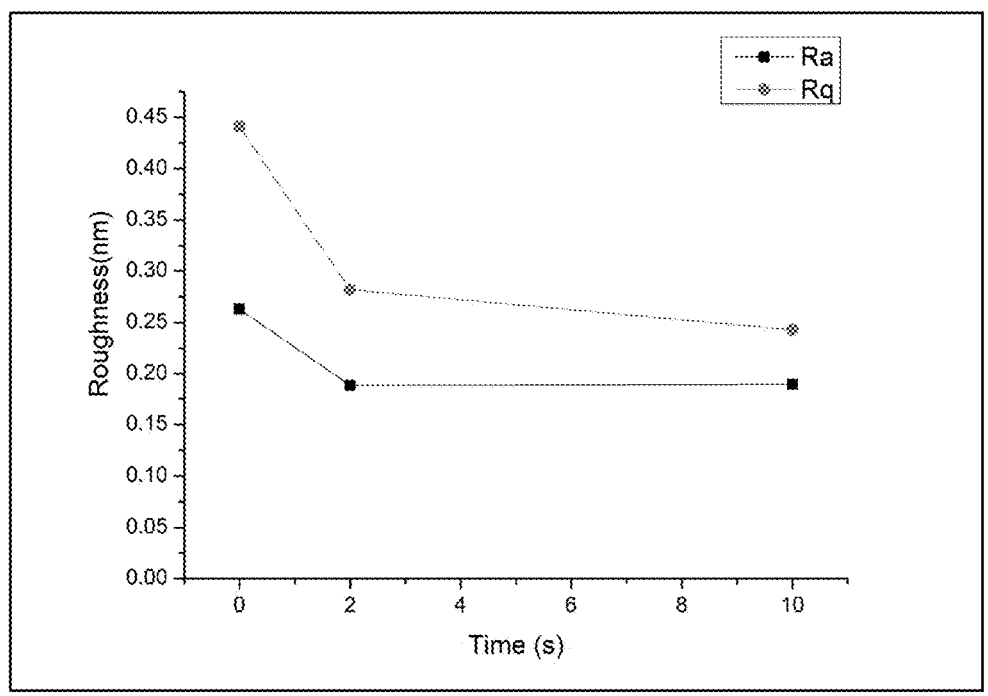
FIG. 2A shows a comparison chart of roughness of the etched film made of silicon dioxide.

Please refer FIG. 2A. FIG. 2A shows a comparison chart of roughness of the etched film made of silicon dioxide. In FIG. 2A, the time on the horizontal axis refers to the second duration. It can be seen, in the control group (i.e. the second duration is 0 s), Rq (Root Mean Square roughness) is 0.441 nm, Ra (Average roughness) is 0.263 nm. In the first treatment group (i.e. the second duration is 2 s), Rq (Root Mean Square roughness) is 0.282 nm, Ra (Average roughness) is 0.189 nm. In the second treatment group (i.e. the second duration is 10 s), Rq (Root Mean Square roughness) is 0.243 nm, Ra (Average roughness) is 0.190 nm. Obviously, the roughness of the surface, whether in the first or second treatment group, is lower than that in the control group. It is sufficient to demonstrate that the etching method of the present disclosure is effective for reducing the surface roughness of the film made of silicon dioxide.

Figure 2B:
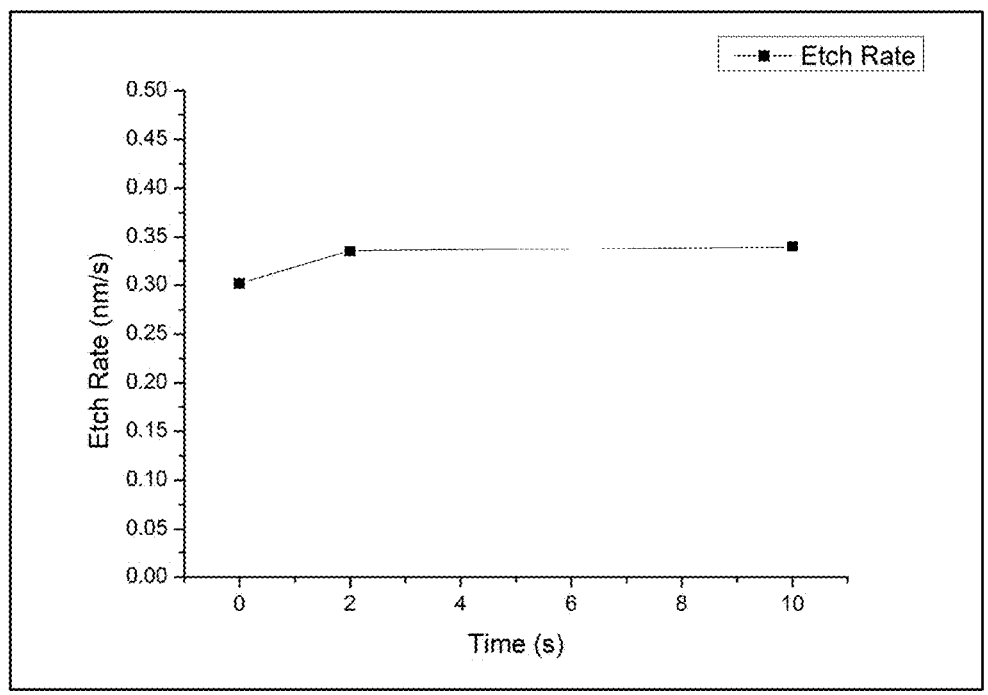
FIG. 2B shows a comparison chart of the etch rate of the film made of silicon dioxide.

Please refer FIG. 2B. FIG. 2B shows a comparison chart of the etch rate of the film made of silicon dioxide. In the control group, the etch rate is 0.30 nm/s. In the first treatment group, the etch rate is 0.34 nm/s. In the second treatment group, the etch rate is 0.30 nm/s. Comparing with FIG. 2A, it can be seen, when the method for reactive ion etching of the present disclosure is used on the film made of silicon dioxide, there is no significant impact on the etch rate of the film made of silicon dioxide.

Figure 3A:
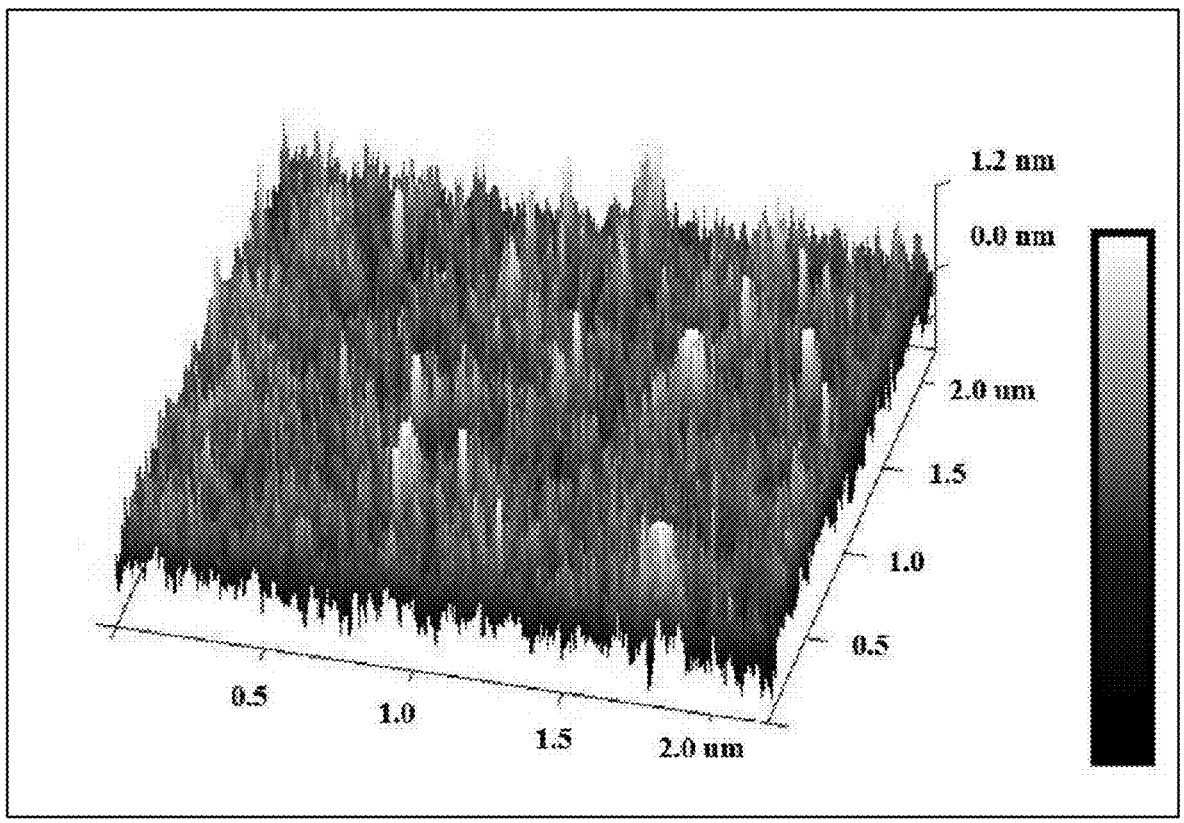
FIG. 3A to FIG. 3C show the surface images of the etched film made of silicon dioxide.
Figure 3B:
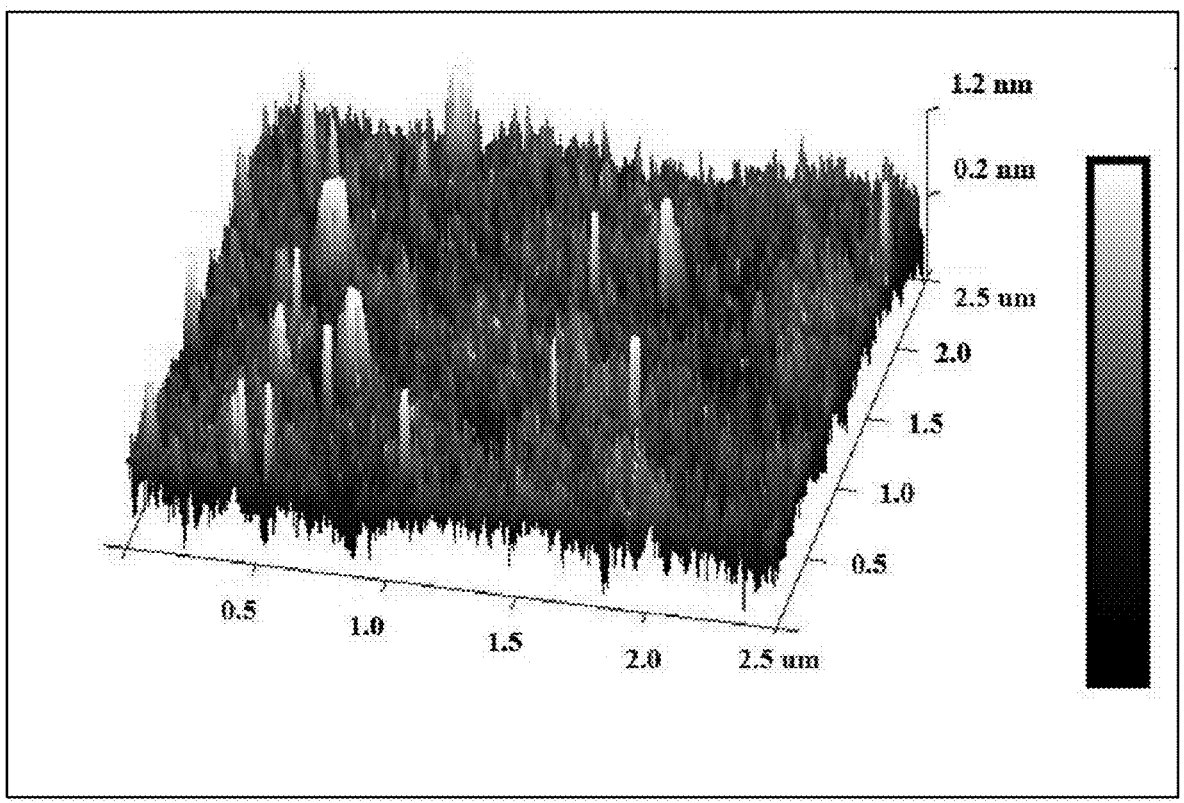
Figure 3C:
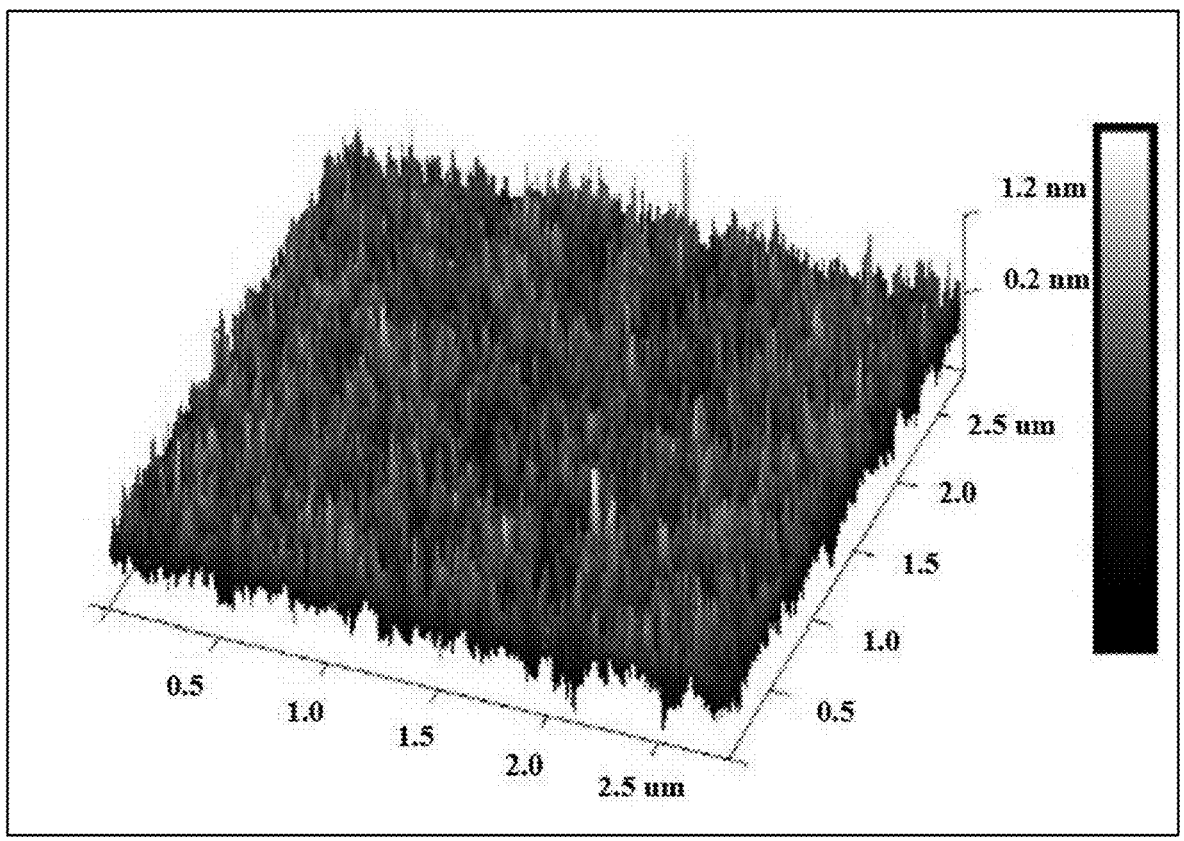

Please refer FIG. 3A to FIG. 3C. FIG. 3A to FIG. 3C show the surface images of the etched film made of silicon dioxide. In detail, FIG. 3A show a 3D image from the atomic force microscope of etching result of silicon dioxide of the control group. FIG. 3B show a 3D image from atomic force microscope of etching result of silicon dioxide of the first treatment group. FIG. 3C show a 3D image from atomic force microscope of etching result of silicon dioxide of the second treatment group. As shown in FIG. 3A, the surface significantly has high roughness because of multiple protuberances thereon. Please refer to FIG. 3B, when the second duration is added to 2 seconds, the protuberances are reduced significantly, so the roughness is also reduced significantly. Please refer FIG. 3C, when the second duration is added to 10 seconds, there are almost no protuberances on the surface, the roughness is drastically reduced.

In the method for reactive ion etching of the present disclosure, the etching gas is introduced into the vacuum chamber, and the reactive ion etching is started. When the reactive ion etching lasts for the first duration, the reactive ion etching is stopped for the second duration in order to make the vacuum chamber in a high-clean state. The inventors believe that while the etching gas is extracted, the residual etching gas and by-products generated by etching are also extracted from the vacuum chamber together, so as to avoid the residual etching gas and the by-products staying on the film and hindering the etching, so as to form a relative flat surface. In addition, after stopping etching for a period of time, the heat in the vacuum chamber is conducted outward via the inner wall of the chamber, and the vacuum chamber is cool down. Thereby, the unexpected collision caused by ions to the film at high temperature is reduced, and the surface roughness of the film after etching is effectively reduced. Furthermore, based on the aforementioned physical principles, the inventors further believe that when the reactive ion etching method of the present disclosure is applied to the films made of other materials, the effect of reducing the surface roughness of the films can also be achieved.

Those skilled in the art will readily observe that numerous modifications and alternatives of the device and method may be made while retaining the teachings of the invention. Accordingly, the above disclosure should be construed as limited only by the meters and bounds of the appended claims.

We claim:

1. A method for reactive ion etching comprising:
   (a) placing a film to be etched in a vacuum chamber;
   (b) introducing an etching gas into the vacuum chamber;
   (c) starting a reactive ion etching to etch the film via continuous introduction of the etching gas in a first duration;
   (d) stopping reactive ion etching and extracting the remaining gas from the vacuum chamber in a second duration, such that the vacuum chamber is brought to a high-clean state with a pressure below 0.1 Pa; and
   (e) repeating the step (b) to (d) until an etching depth of the film is reached to a predetermined depth.

2. The method for reactive ion etching according to claim 1, wherein in the step (d), introducing of the etching gas into the vacuum chamber is stopped.

3. The method for reactive ion etching according to claim 1, wherein in the step (d), an inert gas is introduced into the vacuum chamber.

4. The method for reactive ion etching according to claim 1, wherein the film is made of hexagonal boron nitride.

5. The method for reactive ion etching according to claim 1, wherein the etching gas is sulfur hexafluoride.

* * * * *